(12) United States Patent
Yang et al.

(10) Patent No.: US 11,908,753 B2
(45) Date of Patent: Feb. 20, 2024

(54) TEST HEAD CONNECTION METHOD

(71) Applicants: Kao-Shan Yang, Taoyuan (TW); Ching-Li Lin, Taoyuan (TW)

(72) Inventors: Kao-Shan Yang, Taoyuan (TW); Ching-Li Lin, Taoyuan (TW)

(73) Assignee: Chroma ATE Inc., Taoyuan (TW)

( * ) Notice: Subject to any disclaimer, the term of this patent is extended or adjusted under 35 U.S.C. 154(b) by 0 days.

(21) Appl. No.: 17/520,631

(22) Filed: Nov. 6, 2021

(65) Prior Publication Data

US 2022/0068726 A1 Mar. 3, 2022

(30) Foreign Application Priority Data

Nov. 18, 2020 (TW) .................. 109140284

(51) Int. Cl.
| | | |
|---|---|---|
| *H01L 21/66* | (2006.01) | |
| *H01L 21/683* | (2006.01) | |
| *G01R 1/00* | (2006.01) | |
| *G01R 1/04* | (2006.01) | |
| *G01R 1/067* | (2006.01) | |
| *G01R 1/073* | (2006.01) | |
| *G01R 31/00* | (2006.01) | |
| *G01R 31/26* | (2020.01) | |
| *G01R 31/28* | (2006.01) | |

(52) U.S. Cl.
CPC .......... *H01L 22/12* (2013.01); *G01R 1/07342* (2013.01); *H01L 21/6838* (2013.01)

(58) Field of Classification Search
CPC ......... H01L 21/66; H01L 21/683; G01R 1/00; G01R 1/04; G01R 1/067; G01R 1/073; G01R 31/00; G01R 31/26; G01R 31/28
See application file for complete search history.

(56) References Cited

U.S. PATENT DOCUMENTS

| | | | |
|---|---|---|---|
| 9,903,885 B1* | 2/2018 | Fox .................... | G01R 31/2601 |
| 2003/0201764 A1* | 10/2003 | Jafari ................. | G01R 31/2886 |
| | | | 324/750.23 |
| 2009/0237100 A1* | 9/2009 | Namiki .............. | G01R 31/2887 |
| | | | 324/756.03 |
| 2012/0105304 A1* | 5/2012 | Ma ....................... | H01Q 1/2283 |
| | | | 343/906 |

\* cited by examiner

*Primary Examiner* — Neel D Shah

(57) ABSTRACT

Herein disclosed is a test head connection method, the method comprises the following steps. First, a load board and a card holder are provided between a test head and a probing machine, the card holder is disposed in the probing machine, and the card holder is used to accommodate the load board. A vacuum function of the test head is activated, and the test head is moved to align the card holder. The test head is moved to touch the load board in the card holder. At least one clamping piece is used to fix the test head and the card holder. Wherein the load board and a wafer are connected by direct probing.

10 Claims, 7 Drawing Sheets

TEST HEAD CONNECTION METHOD

BACKGROUND OF THE INVENTION

CROSS REFERENCE TO RELATED APPLICATION

The present application claims priority to Taiwan patent application Serial No. 109140284 filed on Nov. 18, 2020, the entire content of which is incorporated by reference to this application.

1. FIELD OF THE INVENTION

The present invention pertains to a method for connecting a test head, more specifically to a method for connecting a test head and a probing machine by direct docking.

2. DESCRIPTION OF THE PRIOR ART

In order to properly move and load a wafer, the wafer is usually placed in a probing machine during test procedures and tested by a test head. Generally speaking, the test head may have many probe cards which are electrically connected to a load board, and then the load board is electrically connected to the wafer. Traditionally, the load board does not directly contact the wafer. For example, the load board should be connected to a pogo tower, and then the pogo tower contacts the wafer. Since the pogo tower and the load board need to be placed between the test head and the probing machine, it is obvious that the test head will be away from the probing machine. In addition, because there is the pogo tower disposed between the load board and the wafer, which makes the signal transmission path much longer, and there will be more interference and greater signal attenuation.

To solve the above-mentioned problem of long signal transmission paths, there are some new probing machines that allow the load board to contact the wafer. This connection means between the load board and the wafer is called "direct docking". Since the load board and the wafer are direct docking, there is no need for the pogo tower, which can make the signal transmission path shorter, so it is gradually being adopted by the industry. However, for the traditional probing machine, there is currently no way to remove the pogo tower and switch to the direct docking mode. One reason is that the traditional load board is locked to the test head in the first place, and the pogo tower is also locked to the probing machine. While testing the wafer traditionally, the test head and the probing machine are fixed together by mechanical means to fix the relative position of the load board and the pogo tower, and then the load board can be electrically connected to the wafer through the pogo tower. However, the traditional probing machine is designed to have the pogo tower, and the load board and the wafer are not close to each other. In other words, even though the pogo tower is removed, the load board is still away from the wafer by a considerable distance. And, if the load board is still locked to the test head, there is a problem that the load board cannot touch the wafer for sure. Accordingly, the industry needs a new method for connecting the test head, so that the test head and the probing machine can be adjusted to operate in the direct docking mode.

SUMMARY OF THE INVENTION

The present invention provides a test head connection method, which can be used to connect a test head to a probing machine. In the method, the load board is set on the probing machine instead of the test head, and when the test head contacts the load board, the load board can be sucked tightly by the vacuum function of the test head to increase the stability between the test head and the probing machine.

The present invention discloses a test head connection method comprising the following steps: disposing a load board and a test fixture between the test head and a probing machine; activating a vacuum function of the test head; moving the test head to align the test fixture; moving the test head until touching the load board in the test fixture; fixing the test head and the test fixture by at least one engaging member. Wherein the test fixture is disposed in the probing machine, the test fixture is used to accommodate the load board, and the load board is configured to connect a wafer by direct docking.

In some embodiments, the test fixture defines a first upper surface, the first upper surface defines a first accommodating space, and the first accommodating space may be used for accommodating the load board. When the load board is accommodated in the first accommodating space, the load board and the first upper surface may form a coplanar surface. Besides, the test head connection method may further comprise: providing a fixing plate detachably locked to the probing machine. Wherein a second upper surface of the fixing plate defines a second accommodating space, and the second accommodating space may be used for accommodating the test fixture. In addition, the first upper surface and the second upper surface are not coplanar, and the test fixture is detachably locked in the second accommodating space of the fixing plate.

In some embodiments, the load board may be detachably locked in the first accommodating space. Besides, in the step of moving the test head to align the test fixture may further comprise: providing an alignment member, disposed on the test fixture, to guide the test head to align with the test fixture. In addition, the test head may contact an upper surface of the load board, and the test fixture may contact a lower surface of the load board. Moreover, the upper surface of the load board defines at least a vacuum area, and the vacuum area may be surrounded by a metal strip.

Based on the above, the test head connection method provided by the present invention can be used to connect the test head to the probing machine, and the vacuum function of the test head can be used to suck the load board tightly, so that the load board can be pressed toward the test head more efficiently. In addition, since the load board is arranged in the probing machine, the stability between the test head and the probing machine can also be increased.

BRIEF DESCRIPTION OF THE APPENDED DRAWINGS

DETAILED DESCRIPTION OF THE INVENTION

The features, objectives, and functions of the present invention are further disclosed below. However, it is only a few of the possible embodiments of the present invention, and the scope of the present invention is not limited thereto; that is, the equivalent changes and modifications done in accordance with the claims of the present invention will remain the subject of the present invention. Without departing from the spirit and scope of the invention, it should be considered as further enablement of the invention.

Figure 1:
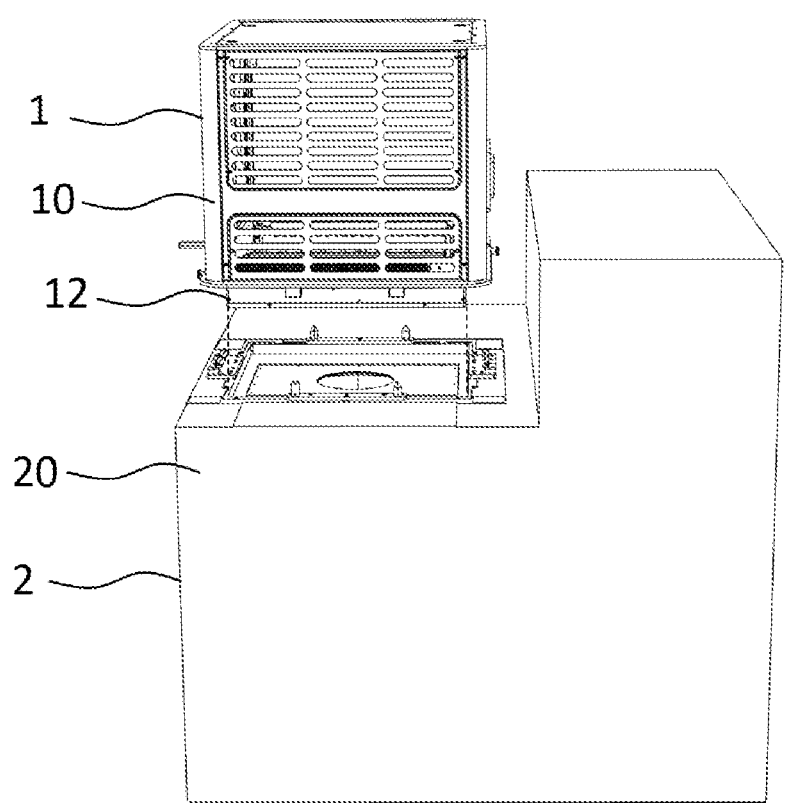
FIG. 1 is a schematic diagram of a test head and a probing machine in accordance with an embodiment of the present invention.

Please refer to FIG. 1, FIG. 1 is a schematic diagram of a test head and a probing machine in accordance with an embodiment of the present invention. As shown in FIG. 1, the test head connection method of the present invention can be used to connect the test head 1 to the probing machine 2. The probing machine 2 can be provided with a wafer to be tested (not shown in the figures), and the test head 1 can be electrically connected to the wafer via a load board (not shown in FIG. 1). In order to show the structure and components between the test head 1 and the probing machine 2, FIG. 1 illustrates that the test head 1 is slightly away from the probing machine 2. It can be seen that the test head 1 is above the probing machine 2, and the test head 1 has not been connected to the probing machine 2. In practice, the test head 1 can also be connected with a robotic arm or crane (not shown in the figures), which can allow the test head 1 to move, tilt, or flip in any directions. For example, the robotic arm or crane can allow the test head 1 to vertically approach or move away from the probing machine 2, the robotic arm or crane and can also rotate the test head 1 when the internal component of the test head 1 needs adjustment. Of course, it is also possible for the robotic arm or crane to move the test head 1 horizontally to other positions, which is not limited in this embodiment. The structure and operation mode of the test head 1 and the probing machine 2 will be described below respectively.

Figure 2:
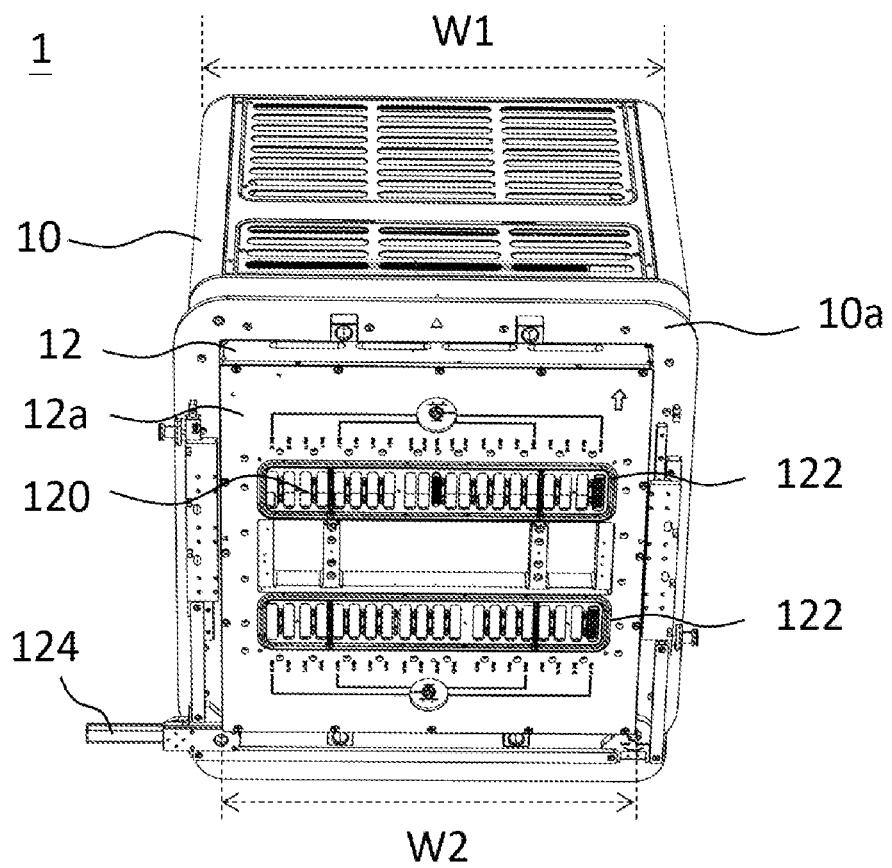
FIG. 2 is a perspective view of the test head in accordance with an embodiment of the present invention.
Figure 3:
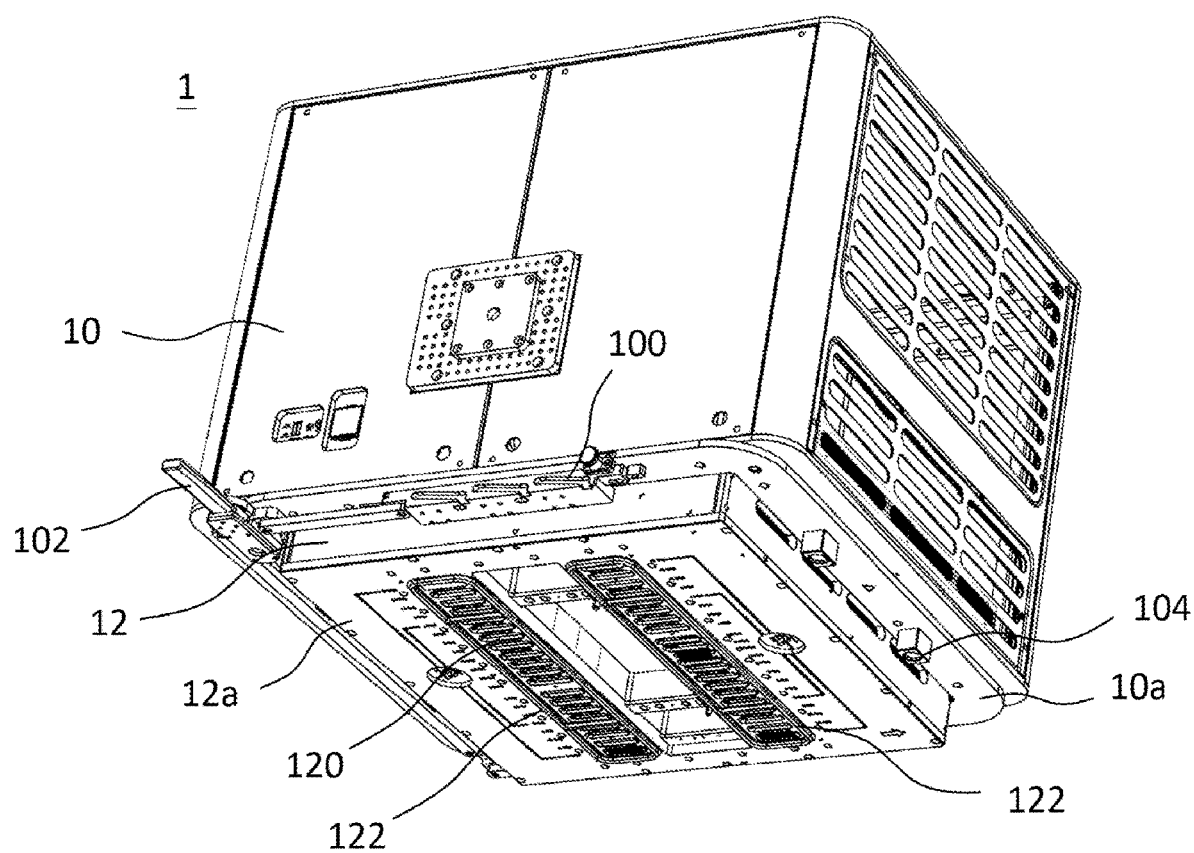
FIG. 3 is a perspective view from another angle of the test head in accordance with an embodiment of the present invention.

Please refer to FIG. 1, FIG. 2 and FIG. 3 together, FIG. 2 is a perspective view of the test head in accordance with an embodiment of the present invention, and FIG. 3 is a perspective view from another angle of the test head in accordance with an embodiment of the present invention. As shown in the figures, the test head 1 may has a housing 10 and a base body 12 protruding from the housing 10 in appearance. In one example, the housing 10 may define a bottom surface 10a, and the base body 12 may also define a test surface 12a. Both the bottom surface 10a and the test surface 12a face the probing machine 2 in FIG. 1. The base body 12 is approximately cube-shaped, and the width W2 of the base body 12, in the same axial direction, is slightly narrower than the width W1 of the housing 10. The present embodiment does not limit the numerical or proportional value between the width W1 and the width W2. Since the base body 12 protrudes from the bottom surface 10a, persona having ordinary skill in the art can understand that the bottom surface 10a and the test surface 12a will not be coplanar. In one example, the test surface 12a is closer, in FIG. 1, to the probing machine 2 than the bottom surface 10a. In addition, the housing 10 can be provided with various components for the electrical testing and the vacuum function. For example, the housing 10 can be provided with multiple probe cards, and each probe card can have more than one probe set. The probe sets can protrude from the test surface 12a through an opening 120 on the test surface 12a.

In an example, each opening 120 on the test surface 12a does not necessarily correspond to one of the probe cards. For example, there may be only a few probe cards inside the housing 10, so that some openings 120 may not have protruding probe sets. Taking the example shown in FIG. 2 and FIG. 3, the openings 120 on the test surface 12a can be divided into two rows, and the number of the openings 120 in each row is the same. This embodiment does not limit the number of the openings 120 on the test surface 12a. The openings in each row can be surrounded by a sealing strip 122 in appearance. In practice, the area surrounded by the sealing strip 122 is provided with one or more through holes for vacuum suction, that is, the area surrounded by the sealing strip 122 is related to the vacuum function of the test head 1, which will be described later.

Figure 4:
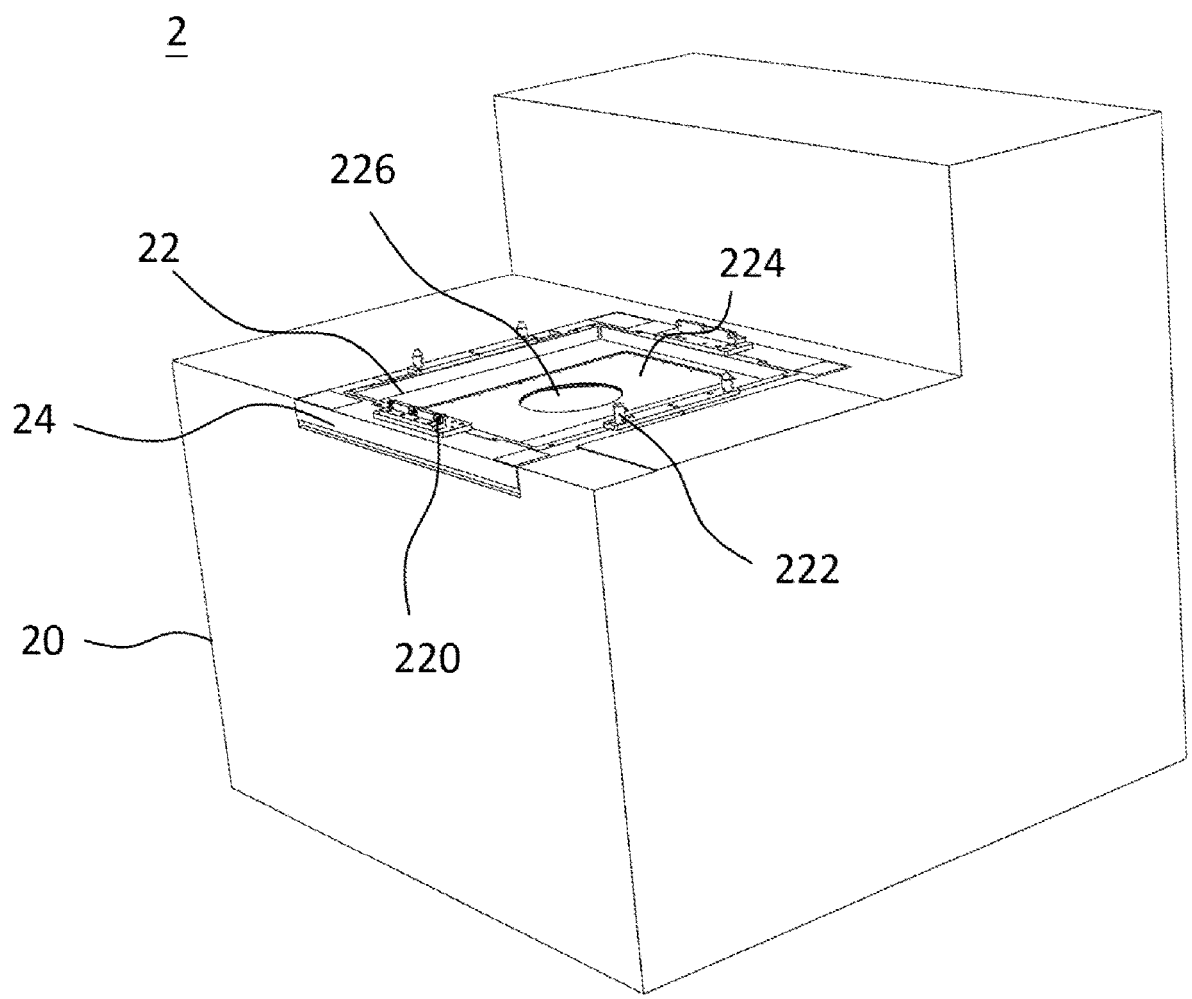
FIG. 4 is a perspective view of the probing machine in accordance with an embodiment of the present invention.

In addition, the housing 10 may also be provided with an engaging member 100, a fixing member 102, and an alignment member 104. To understand how the engaging member 100, the fixing member 102, and the alignment member 104 are fixed to the probing machine 2, the probing machine 2 shown in FIG. 4 will be used for description. Please refer to FIG. 1, FIG. 3 and FIG. 4 together, FIG. 4 is a perspective view of the probing machine in accordance with an embodiment of the present invention. As shown in the figures, the probing machine 2 may comprise a housing 20, and a test fixture 22 and a fixing plate 24 may be provided on the side of the housing 20 adjacent to the test head 1. In one example, the fixing plate 24 is first disposed on the housing 20, and the test fixture 22 is then fixed to the housing 20 by the fixing plate 24. In detail, the test fixture 22 is detachably locked to the fixing plate 24. For example, the test fixture 22 can be fixed to the fixing plate 24 with screws, which is not limited in this embodiment.

In addition, the test fixture 22 may be provided with an engaging member 220 and an alignment member 222, and the engaging member 220 and the engaging member 100 may structurally correspond to each other. For example, the engaging member 100 may be a slot, the engaging member 220 may be a short post which can be slid into the slot to be locked and fixed to each other. In order to assist the engaging member 220 to enter the engaging member 100, the alignment member 104 and the alignment member 222 can be used to align the test head 1 and the probing machine 2. As shown in FIG. 3 and FIG. 4, the alignment member 104 may be a groove, the alignment member 222 may be a column, and the alignment member 104 may accommodate the alignment member 222. This embodiment does not limit the shape of the alignment member 104 and the shape of the alignment member 222, as long as the shape of the alignment member 222 can correspond to the shape of the alignment member 104, it should be in the scope described in this embodiment. Instead of setting the engaging member 220 and the alignment member 222 shown in FIG. 4 on the edge of the test fixture 22 and facing the test head 1 in FIG. 1, the engaging member 220 and the alignment member 222 can be set on the fixing plate 24. In one example, in order to ensure that the engaging member 100 and the engaging member 220 are fixed together, the user can pull the fixing member 102 (such as a handle) on the test head 1 to lock the engaging member 100 and the engaging member 240 and make the test head 1 and the probing machine 2 approximately fixed in position. For example, the fixing member 102 may trigger a blocking structure (not shown in figures)

which can prevent the engaging member 220 from exiting or detaching from the engaging member 100. This embodiment does not limit the means of the blocking structure.

Figure 5:
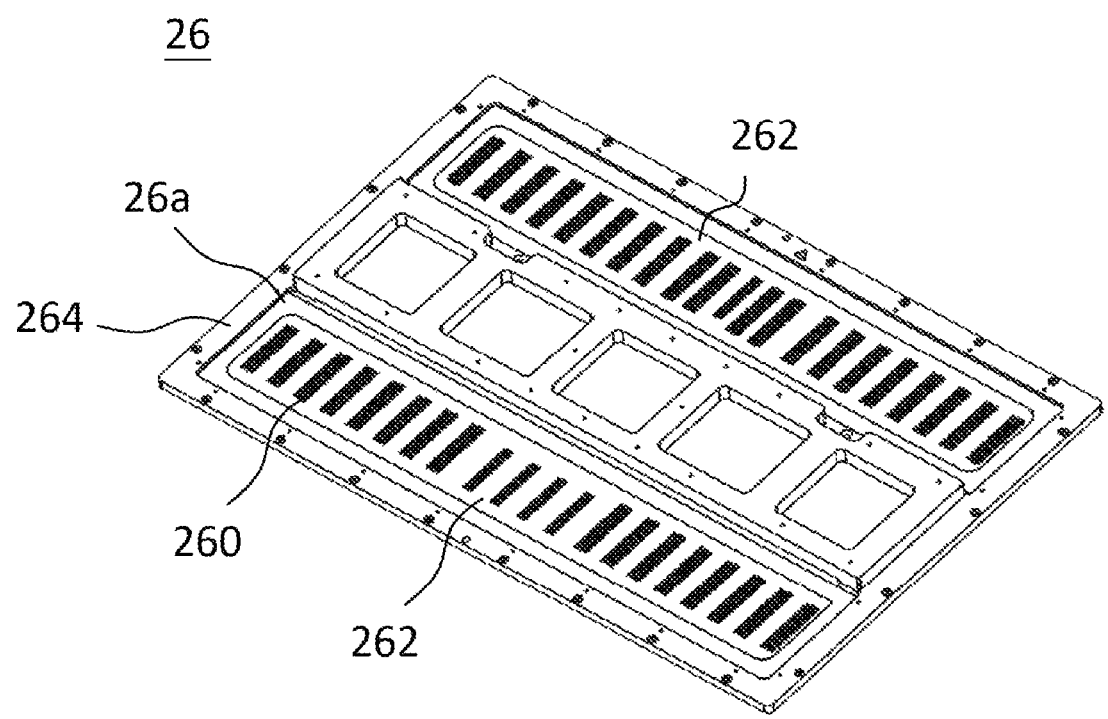
FIG. 5 is a schematic diagram of a load board in accordance with an embodiment of the present invention.
Figure 6:
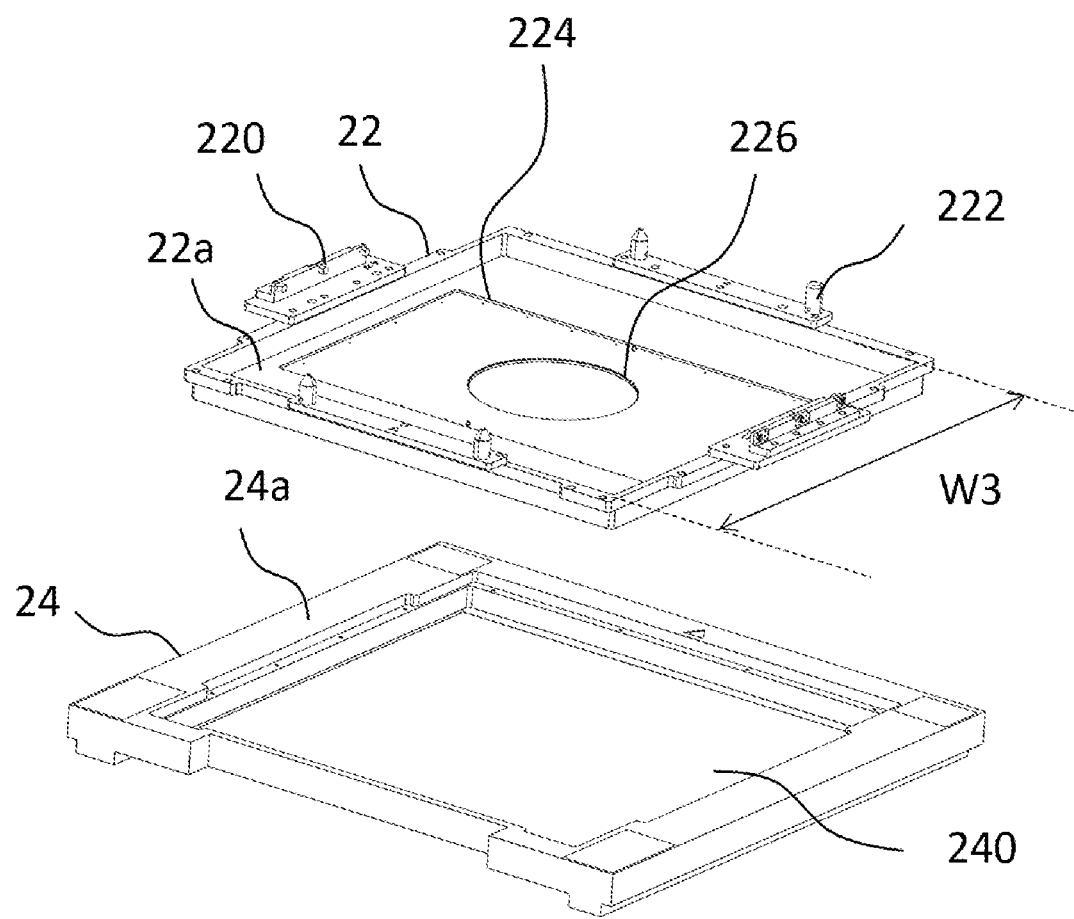
FIG. 6 is a schematic diagram of the load board and a fixing plate in accordance with an embodiment of the present invention.

By the definition of direct docking, the test surface 12a of the test head 1 will contact the load board, and the load board will directly dock the wafer. In order to illustrate the above-mentioned direct docking, please refer to FIG. 5 and FIG. 6 together. FIG. 5 is a schematic diagram of a load board in accordance with an embodiment of the present invention. FIG. 6 is a schematic diagram of the load board and a fixing plate in accordance with an embodiment of the present invention. FIG. 6 shows that the test fixture 22 and the fixing plate 24 are separable. As shown in the figures, the test fixture 22 has an upper surface 22a (first upper surface), and the upper surface 22a defines an accommodating space 224 (first accommodating space). The fixing plate 24 is defined with an upper surface 24a (second upper surface), and the center of the upper surface 24a has a recess, and the recess may be defined as an accommodating space 240 (second accommodating space). In the example shown in FIG. 6, the fixing plate 24 may be a hollow frame. The present embodiment does not limit the size of the fixing plate 24, as long as the accommodating space 240 can be used for accommodating the test fixture 22.

Except for the aforementioned engaging member 220 and the alignment member 222, the test fixture 22 has a basin-shaped in appearance. The edge of the basin-shaped test fixture 22 can be locked to the fixing plate 24, and the bottom of the basin-shaped test fixture 22 can be accommodated in the fixing plate 24. In one example, the test fixture 22 is locked to the upper surface 24a, so the edge of the test fixture 22 is higher than the bottom of the test fixture 22. That is, the edge of the test fixture 22 is closer to the test surface 12a of the test head 1 than the bottom of the test fixture 22. In practice, the bottom of the test fixture 22 is the upper surface 22a (first upper surface). When the test fixture 22 is contained in the fixing plate 24, the upper surface 22a and the upper surface 24a are not coplanar. In addition, the accommodating space 224 is a slightly recessed area on the upper surface 22a, and the accommodating space 224 can be used to accommodate the load board 26. The accommodating space 224 may be integrally formed with the upper surface 22a, or be a part of the upper surface 22a. The size of the load board 26 should be smaller than or equal to the accommodating space 224, that is, the load board 26 should be able to put into the accommodating space 224.

The upper surface 26a of the load board 26 which is adjacent to the test head 1 (shown in FIG. 5) may have a plurality of pads 260 and vacuum areas 262. Similar to the examples shown in FIG. 2 and FIG. 3, the pads 260 on the load board 26 can also be divided into two rows, and each row of the pads 260 is located in one of the vacuum areas 262. In one example, the load board 26 is further provided with a metal strip 264 on the edge of the upper surface 26a. The metal strip 264 can be regarded as a rectangle in appearance and surround both of the vacuum areas 262. The present embodiment does not limit the position and shape of the metal strip 264. For example, the metal strip 264 may not be arranged on the edge of the upper surface 26a, but on the edge of each vacuum area 262. In this case, the metal strip 264 can be regarded as two rectangles, each rectangle encloses one of the vacuum areas 262. Of course, on the lower side of the load board 26 away from the test head 1 (for example, the other surface shown in FIG. 5) may have a plurality of probes (not shown) for connecting the wafer, and the probe can pass through the upper surface 22a through the slot 226 in the test fixture 22, and directly contact the wafer (not shown) disposed below, which will not be rep In practice, in addition to the test fixture 22 is locked to the fixing plate 24, and the fixing plate 24 is fixed to the housing 20, the load board 26 will also be pre-locked in the accommodating space 224 of the test fixture 22. In one example, when the load board 26 is locked in the accommodating space 224, the upper surface 26a of the load board 26 can be the same height (coplanar) with the upper surface 22a of the test fixture 22, or the top of the metal strip 264 located on the upper surface 26a can be the same height (coplanar) with the upper surface 22a of the test fixture 22, which is not limited in this embodiment. In other words, when the load board 26 is locked in the accommodating space 224, at least a part of the load board 26 will be coplanar with the upper surface 22a. In addition, when the test head 1 and the probing machine 2 are approaching to each other, the base body 12 of the test head 1 is aligned with the test fixture 22, which also represents the openings 120 on the test surface 12a can be aligned with the pads 260 on the upper surface 26a since the load board 26 and the test fixture 22 do not move relatively to each other. In practice, the upper surface 26a of the load board 26 is used to contact the base body 12 of the test head 1, and the surface (for example, the lower side) of the load board 26 opposite to the upper surface 26a is used to contact the test fixture 22.

Then, when the test head 1 and the probing machine 2 continue approaching to each other until the test surface 12a of the base body 12 touches, or adjacent to, the upper surface 22a of the test fixture 22, and adjacent to the upper surface 26a of the load board 26. In order to allow the probe sets protruding from the opening 120 to contact the pad 260 firmly, the test head 1 can first activate the vacuum function which means to exhaust air from a position on the base body 12 adjacent to the openings 120 when the test surface 12a of the base body 12 moves toward the upper surface 26a of the load board 26. In other words, when the test surface 12a is pushed to the upper surface 26a, the sealing strip 122 will be pressed against the edge of the vacuum area 262, so that the space enclosed by the test surface 12a, the upper surface 26a, and the sealing strip 122 is airtight. And then, the base body 12 can exhaust air from the test surface 12a. It is worth mentioning that when the test head 1 and the probing machine 2 are approaching to each other, the test head 1 and the probing machine 2 can perform the alignment procedures, such as aligning the alignment member 104 and the alignment member 222 with each other, and let the engaging member 220 fit or enter the engaging member 100. The test head 1 and the probing machine 2 can be aligned first, or the test head 1 can start the vacuum function first, and these two steps should be interchangeable. In addition, in order to avoid excessive compression of the sealing strip 122 on the upper surface 26a and damage to the probe sets and the pads 260 protruding from the openings 120, the metal strip 264 can be used as a support to maintain the gap between the test surface 12a and the upper surface 26a.

After the engaging member 220 enters the engaging member 100, as described above, the user can pull the fixing element 102 on the test head 1 to lock the relative position of the engaging member 100 and the engaging member 240. In this step, it can be said that the test head 1 has been fully connected or fixed to the probing machine 2. It is worth mentioning that when the test head 1 has been connected to the probing machine 2, part of the base body 12 will be pushed into the recess, the basin-shaped structure, of the test fixture 22. For example, the recess, the basin-shaped structure, of the test fixture 22 may be square in appearance and have a width W3 in an axial direction. At this time, as long as the width W2 of the base body 12 in the axial direction is smaller than the width W3, part of the base body 12 can be sunk into the upper surface 24a, so that the test surface 12a of the base body 12 will be in the position between the upper surface 22a (or upper surface 26a) and the upper surface 24a. Different from the traditional pogo tower, if the traditional pogo tower is removed, the distance between the load board and the wafer will be too large, and there will be a problem that the load board cannot touch the wafer. In this embodiment, the test fixture 22 is designed to have a recess, the basin-shaped structure, so that the base body 12 can be pushed into the probing machine 2 and is closer to the load board 26, thereby solving the problem that the load board cannot touch the wafer.

On the other hand, the vacuum function of the test head 1 mentioned in this embodiment can be used for other purposes in addition to stabilizing the electrical connection between the probe sets and the pads 260. The test head 1 may be originally designed with the vacuum function, but it is not used to stabilize the electrical connection between the probe sets and the pads 260. For example, the vacuum function may be designed to suck exhaust gas around the object under test or suck the replaced pogo tower, that is, a new application of the vacuum function is introduced in this embodiment.

Figure 7:
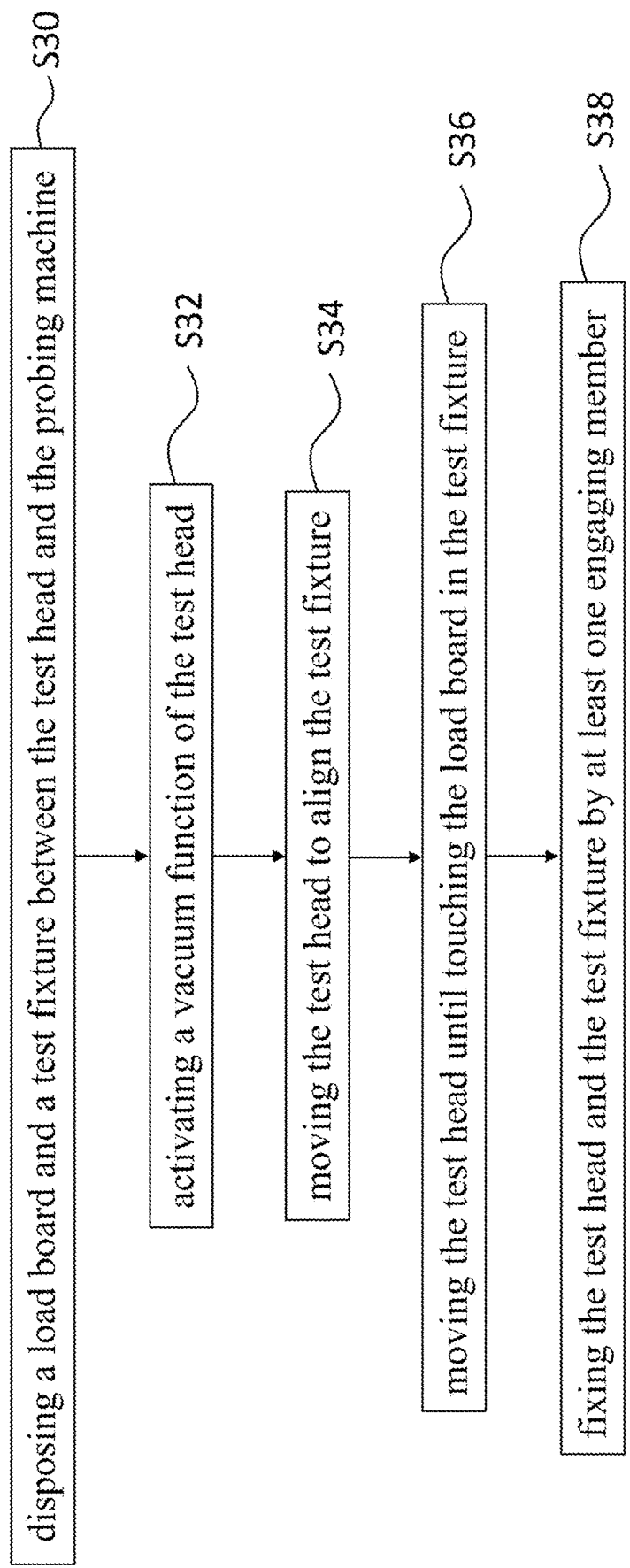
FIG. 7 is a flowchart of the test head connection method in accordance with an embodiment of the present invention.

In order to explain the test head connection method provided by the present invention, please refer to FIG. 1 to FIG. 7 together. FIG. 7 shows a flowchart of the test head connection method according to an embodiment of the present invention. As shown in the figures, in step S30, the load board 26 and the test fixture 22 are arranged between the test head 1 and the probing machine 2. The test fixture 22 is set in the probing machine 2, and the test fixture 22 is used for accommodating the load board 26. In step S32, the vacuum function of the test head 1 is activated, and in step S34, the test head 1 is moved to align the test fixture 22. Next, in step S36, the test head 1 is moved to contact the load board 26 in the test fixture 22. And in step S38, the engaging member 100 and the engaging member 220 are used to fix the test head 1 and the test fixture 22. In the above steps, the test head 1 and the probing machine 2 are connected in the direct docking connection, and the load board 26 can directly contact the wafer. The other steps of the test head connection method have been described in the previous embodiment, and this embodiment will not be repeated here.

In summary, the test head connection method provided by the present invention can be used by the old probing machine. As long as the test fixture is replaced with a recessed basin-shaped structure, the old probing machine and the test head can be connected to each other in the direct docking connection. In this way, the problem of the long signal transmission path corresponding to the traditional pogo tower is solved. In addition, the present invention can also use the vacuum function of the test head can be used to suck the load board tightly, so that the load board can be pressed toward the test head more efficiently. Since the load board is arranged in the probing machine, the stability between the test head and the probing machine can also be increased.

What is claimed is:

1. A test head connection method for connecting a test head and a probing machine, comprising:
   disposing a load board and a test fixture between the test head and the probing machine;
   activating a vacuum function of the test head;
   moving the test head to align the test fixture;
   moving the test head until touching the load board in the test fixture; and
   fixing the test head and the test fixture by at least one engaging member;
   wherein the test fixture is disposed in the probing machine, and the test fixture is used to accommodate the load board;
   wherein the load board is configured to connect a wafer by direct docking without a pogo tower.

2. The test head connection method according to claim 1, wherein the test fixture defines a first upper surface, the first upper surface defines a first accommodating space, and the first accommodating space is used for accommodating the load board.

3. The test head connection method according to claim 2, wherein when the load board is accommodated in the first accommodating space, the load board and the first upper surface form a coplanar surface.

4. The test head connection method according to claim 2, further comprising:
   providing a fixing plate detachably locked to the probing machine;
   wherein a second upper surface of the fixing plate defines a second accommodating space, and the second accommodating space is used for accommodating the test fixture.

5. The test head connection method according to claim 4, wherein the first upper surface and the second upper surface are not coplanar.

6. The test head connection method according to claim 4, wherein the test fixture is detachably locked in the second accommodating space of the fixing plate.

7. The test head connection method according to claim 2, wherein the load board is detachably locked in the first accommodating space.

8. The test head connection method according to claim 1, wherein in the step of moving the test head to align the test fixture further comprises:
   providing an alignment member, disposed on the test fixture, to guide the test head to align with the test fixture.

9. The test head connection method according to claim 1, wherein the test head contacts an upper surface of the load board, and the test fixture contacts a lower surface of the load board.

10. The test head connection method according to claim 9, wherein the upper surface of the load board defines at least a vacuum area, and the vacuum area is surrounded by a metal strip.

* * * * *